(12) United States Patent
Ryu

(10) Patent No.: US 11,502,267 B2
(45) Date of Patent: Nov. 15, 2022

(54) INORGANIC LIGHT EMITTING DIODE AND INORGANIC LIGHT EMITTING DEVICE INCLUDING THE SAME

(71) Applicant: LG DISPLAY CO., LTD., Seoul (KR)

(72) Inventor: Young-Ju Ryu, Paju-si (KR)

(73) Assignee: LG Display Co. Ltd., Seoul (KR)

( * ) Notice: Subject to any disclaimer, the term of this patent is extended or adjusted under 35 U.S.C. 154(b) by 309 days.

(21) Appl. No.: 17/025,030

(22) Filed: Sep. 18, 2020

(65) Prior Publication Data

US 2021/0126217 A1    Apr. 29, 2021

(30) Foreign Application Priority Data

Oct. 23, 2019 (KR) .................. 10-2019-0132035

(51) Int. Cl.
| | | |
|---|---|---|
| H01L 51/50 | (2006.01) |
| C09K 11/70 | (2006.01) |
| C09K 11/88 | (2006.01) |
| H01L 51/00 | (2006.01) |

(52) U.S. Cl.
CPC .......... *H01L 51/5064* (2013.01); *C09K 11/70* (2013.01); *C09K 11/883* (2013.01); *H01L 51/502* (2013.01); *H01L 51/508* (2013.01); *H01L 51/0035* (2013.01); *H01L 51/0037* (2013.01); *H01L 51/0077* (2013.01); *H01L 51/0081* (2013.01); *H01L 2251/552* (2013.01); *H01L 2251/558* (2013.01)

(58) Field of Classification Search
CPC ............ H01L 51/5096; H01L 51/5056; H01L 51/506; H01L 51/5064; H01L 51/5068
See application file for complete search history.

(56) References Cited

U.S. PATENT DOCUMENTS

2021/0098719 A1* 4/2021 Park .................... H01L 51/0071
2021/0296602 A1* 9/2021 Rand ................... H01L 51/0077

\* cited by examiner

*Primary Examiner* — Jae Lee
(74) *Attorney, Agent, or Firm* — Morgan, Lewis & Bockius LLP

(57) ABSTRACT

An inorganic light emitting diode in which at least one energy control layer including an organometallic compound interacting with a hydroxyquinoline moiety is disposed between an emitting material layer and at least one charge transfer layer and an inorganic light emitting device including the diode are disclosed. An exciton recombination zone is formed at the central region in the EML, and inorganic luminescent particles have minimal surface defects by introducing the energy control layer. The inorganic light emitting diode and the inorganic light emitting device can improve their color purity and luminous efficiency.

21 Claims, 5 Drawing Sheets

INORGANIC LIGHT EMITTING DIODE AND INORGANIC LIGHT EMITTING DEVICE INCLUDING THE SAME

CROSS REFERENCE TO RELATED APPLICATION

This application claims the benefit under 35 U.S.C. § 119(a) to Korean Patent Application No. 10-2019-0132035, filed in the Republic of Korea on Oct. 23, 2019, the entire contents of which are incorporated herein by reference into the present application.

BACKGROUND

Technical Field

The present disclosure relates to a light emitting diode, and more particularly, to an inorganic light emitting diode having excellent color purity and luminous efficiency and an inorganic light emitting device including the diode.

Discussion of the Related Art

As electronic and information technologies progress rapidly, a field of displays for processing and displaying a large quantity of information has been developed rapidly. Accordingly, various flat panel display devices have been widely used. Among the flat panel display devices, an organic light emitting diode (OLED) has come into spotlight. Since the OLED can be formed even on a flexible transparent substrate and has relatively lower power consumption, the OLED display device has attracted a lot of attention as a next-generation display device replacing LCD. However, in case of increasing current densities or raising driving voltages in the OLED for improving luminance in OLED display device, the luminous lifetime of the OLED become shorter owing to thermal degradation and deteriorations of organic materials in the OLED.

Recently, a display device using inorganic luminescent particles such as quantum dot (QD) or quantum rod (QR) has been developed. QD or QR is an inorganic luminescent particle that emits light as unstable stated excitons shift from its conduction band to its valance band. QD or QR has large extinction coefficient, high quantum yield among inorganic particles and generates strong fluorescence. Besides, since QD or QR has different luminescence wavelengths as its sizes, it is possible to obtain light within the whole visible light spectra so as to implement various colors by adjusting sizes of QD or QR.

However, the exciton recombination zone is shifted from the center of an EML to the interface between the EML and a charge transfer layer due to the charge mobility and energy levels of the materials in the charge transfer layer adjacent to the EML that includes the inorganic luminescent particles. In this case, an emission peak other than the intended emission peak is formed, and the color purity of the LED is lowered.

Also, the ligand bound on the surface of the inorganic luminescent particle is separated from the particle in the process of purifying the particle or driving the LED, thus the surface of the inorganic luminescent particle is exposed to outside. As the surface of the particle is exposed, vacancy is generated in the metal component constituting the inorganic luminescent particle having a lattice structure, thus excitons are trapped within the vacancy. For these reasons, the quantum-dot light emitting diode (QLED) into which the inorganic luminescent particles are introduced has exhibited deteriorated luminous efficiency compared to the OLED.

SUMMARY

Accordingly, embodiments of the present disclosure are directed to an inorganic light emitting diode and an inorganic light emitting device having the diode that substantially obviates one or more of the problems due to the limitations and disadvantages of the related art.

An object of the present disclosure is to provide an inorganic light emitting diode that has minimizes defects of an inorganic luminescent particle and improves its luminous efficiency and an inorganic light emitting device including the diode.

Additional features and aspects will be set forth in the description that follows, and in part will be apparent from the description, or may be learned by practice of the inventive concepts provided herein. Other features and aspects of the inventive concept may be realized and attained by the structure particularly pointed out in the written description, or derivable therefrom, and the claims hereof as well as the appended drawings.

To achieve these and other aspects of the inventive concept, as embodied and broadly described, an inorganic light emitting diode comprises a first electrode; a second electrode facing the first electrode; an emitting material layer disposed between the first and second electrodes and including an inorganic luminescent particle; a hole transfer layer disposed between the first electrode and the emitting material layer; and a first energy control layer disposed between the hole transfer layer and the emitting material layer, wherein the first energy control layer includes a first organometallic compound, and wherein the organometallic compound interacts with a hydroxyquinoline moiety.

In another aspect, an inorganic light emitting diode comprises a first electrode; a second electrode facing the first electrode; an emitting material layer disposed between the first and second electrodes and including an inorganic luminescent particle; a hole transfer layer disposed between the first electrode and the emitting material layer; a first energy control layer disposed between the hole transfer layer and the emitting material layer; and a second energy control layer disposed between the emitting material layer and the second electrode, wherein the first and second energy control layers include a first organometallic compound and a second organometallic compound, respectively, and wherein each of the first organometallic compound and the second organometallic compound interacts with a hydroxyquinoline moiety, respectively.

In still another aspect, an inorganic light emitting device comprises a substrate and the light emitting diode over the substrate, as described above.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure, and are incorporated in and constitute a part of this application, illustrate embodiments of the disclosure and together with the description serve to explain principles of the disclosure. In the drawings.

DETAILED DESCRIPTION

Reference will now be made in detail to aspects of the disclosure, examples of which are illustrated in the accompanying drawings.

[Inorganic Light Emitting Device]

Figure 1:
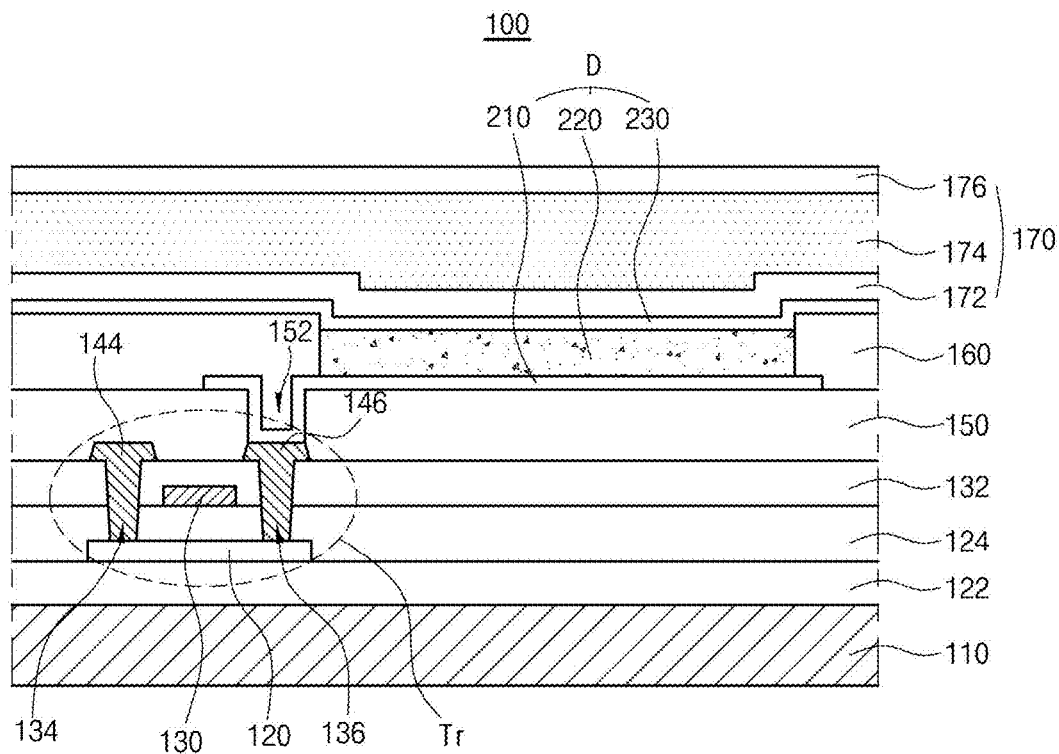
FIG. 1 is a schematic cross-sectional view illustrating an inorganic light emitting display device in accordance with an aspect of the preset disclosure.

The present disclosure relates to an inorganic light emitting diode (LED) which includes at least one energy control layer made of organometallic compound interacting with hydroxyquinoline moiety and disposed between an EML and at least one charge transfer layer and an inorganic light emitting device including the diode. The inorganic LED may be applied to an inorganic light emitting device such as an inorganic light emitting display device and an inorganic light emitting illumination device. FIG. 1 is a schematic cross-sectional view illustrating an inorganic light emitting display device in accordance with the present disclosure.

As illustrated in FIG. 1, an inorganic light emitting display device 100 includes a substrate 110, a thin film transistor Tr over the substrate 110 and an inorganic light emitting diode (LED) D connected to the thin film transistor Tr.

The substrate 110 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 110, over which the thin film transistor Tr and the inorganic LED D are arranged, form an array substrate.

A buffer layer 122 may be disposed over the substrate 110, and the thin film transistor Tr is disposed over the buffer layer 122. The buffer layer 122 may be omitted.

A semiconductor layer 120 is disposed over the buffer layer 122. In one exemplary aspect, the semiconductor layer 120 may include, but is not limited to, oxide semiconductor materials. In this case, a light-shied pattern may be disposed under the semiconductor layer 120, and the light-shield pattern can prevent light from being incident toward the semiconductor layer 120, and thereby preventing the semiconductor layer 120 from being deteriorated by the light. Alternatively, the semiconductor layer 120 may include polycrystalline silicon. In this case, opposite edges of the semiconductor layer 120 may be doped with impurities.

A gate insulating layer 124 made of an insulating material is disposed on the semiconductor layer 120. The gate insulating layer 124 may include, but is not limited to, an inorganic insulating material such as silicon oxide ($SiO_x$) or silicon nitride ($SiN_x$).

A gate electrode 130 made of a conductive material such as a metal is disposed over the gate insulating layer 124 so as to correspond to a center of the semiconductor layer 120. While the gate insulating layer 124 is disposed over a whole area of the substrate 110 in FIG. 1, the gate insulating layer 124 may be patterned identically as the gate electrode 130.

An interlayer insulating layer 132 made of an insulating material is disposed on the gate electrode 130 with covering over an entire surface of the substrate 110. The interlayer insulating layer 132 may include, but is not limited to, an inorganic insulating material such as silicon oxide ($SiO_x$) or silicon nitride ($SiN_x$), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over both sides of the gate electrode 130 with spacing apart from the gate electrode 130. The first and second semiconductor layer contact holes 134 and 136 are formed within the gate insulating layer 124 in FIG. 1. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, each of which includes a conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 1 has a coplanar structure in which the gate electrode 130, the source electrode 144 and the drain electrode 146 are disposed over the semiconductor layer 120. Alternatively, the thin film transistor Tr may have an inverted staggered structure in which a gate electrode is disposed under a semiconductor layer and source and drain electrodes are disposed over the semiconductor layer. In this case, the semiconductor layer may include, but is not limited to, amorphous silicon.

Although not shown in FIG. 1, a gate line and a data line, which cross each other to define a pixel region, and a switching element, which is connected to the gate line and the data line, may be further formed in the pixel region. The switching element is connected to the thin film transistor Tr, which is a driving element. In addition, a power line is spaced apart in parallel from the gate line or the data line, and the thin film transistor Tr may further includes a storage capacitor configured to constantly keep a voltage of the gate electrode for one frame.

Moreover, the inorganic light emitting display device 100 may include a color filter that comprises dyes or pigments for transmitting specific wavelength light of light emitted from the inorganic LED D. For example, the color filter can transmit light of specific wavelength such as red (R), green (G), blue (B) and/or white (W). Each of red, green, and blue color filter may be formed separately in each pixel region. In this case, the inorganic light emitting display device 100 can implement full-color through the color filter.

For example, when the inorganic light emitting display device 100 is a bottom-emission type, the color filter may be disposed on the interlayer insulating layer 132 with corresponding to the inorganic LED D. Alternatively, when the inorganic light emitting display device 100 is a top-emission type, the color filter may be disposed over the inorganic LED D, that is, a second electrode 230.

In addition, the inorganic light emitting display device 100 may further comprise a color conversion film which transforms specific wavelength light among the light emitted from the inorganic LED D. The color conversion film may comprise an inorganic luminescent material such as a quantum dot and/or a quantum rod. For example, the color conversion film may be disposed over the inorganic LED D or under the inorganic LED D.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it may be spaced apart from the second semiconductor layer contact hole 136.

The inorganic LED D includes a first electrode 210 that is disposed on the passivation layer 150 and connected to the drain electrode 146 of the thin film transistor Tr. The inorganic LED D further includes an emissive layer 220 and a second electrode 230 each of which is disposed sequentially on the first electrode 210.

The first electrode 210 is disposed in each pixel region. The first electrode 210 may be an anode and include a conductive material having relatively high work function value. For example, the first electrode 210 may include, but is not limited to, a doped or undoped metal oxide such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium:zinc oxide (Cd:ZnO), fluorine:tin oxide (F:$SnO_2$), indium:tin oxide (In:$SnO_2$), gallium:tin oxide (Ga:$SnO_2$) or aluminum:zinc oxide (Al:ZnO; AZO). Optionally, the first electrode 210 may include a metal or nonmetal material such as nickel (Ni), platinum (Pt), gold (Au), silver (Ag), iridium (Ir) or a carbon nanotube (CNT), other than the above-described metal oxide.

In one exemplary aspect, when the inorganic light emitting display device 100 is a top-emission type, a reflective electrode or a reflective layer (not shown) may be disposed under the first electrode 210. For example, the reflective electrode or the reflective layer (not shown) may comprise, but is not limited to, aluminum-palladium-copper (APC) alloy.

In addition, a bank layer 160 is disposed on the passivation layer 150 in order to cover edges of the first electrode 210. The bank layer 160 exposes a center of the first electrode 210.

An emissive layer 220 is disposed on the first electrode 210. In one exemplary aspect, the emissive layer 220 may have a mono-layered structure of an emitting material layer (EML). Alternatively, the emissive layer 220 may have a multiple-layered structure of an EML 240 or 340, a first charge transfer layer 250 or 350, a second charge transfer layer 270 or 370, an energy control layer 260 or 360 (see, FIGS. 2 and 5). In one exemplary aspect, the emissive layer 220 may have one emitting unit. Alternatively, the emissive layer 220 may have multiple emitting units to form a tandem structure. The emissive layer 220 includes at least one energy control layer so that the inorganic LED D can improve its color purity and luminous efficiency.

The second electrode 230 is disposed over the substrate 110 above which the emissive layer 220 is disposed. The second electrode 230 may be disposed over a whole display area, may include a conductive material having a relatively low work function value compared to the first electrode 210, and may be a cathode. For example, the second electrode 230 may include, but is not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg.

In addition, an encapsulation film 170 may be disposed over the second electrode 220 in order to prevent outer moisture from penetrating into the inorganic LED D. The encapsulation film 170 may have, but is not limited to, a laminated structure of a first inorganic insulating film 172, an organic insulating film 174 and a second inorganic insulating film 176.

Moreover, a polarizer may be attached to the encapsulation film 170 in order to decrease external light reflection. For example, the polarizer may be a circular polarizer. In addition, a cover window may be attached to the encapsulation film 170 or the polarizer. In this case, the substrate 110 and the cover window may have a flexible property, thus the inorganic light emitting display device 100 may be a flexible display device.

[Inorganic Light Emitting Diode]

Figure 2:
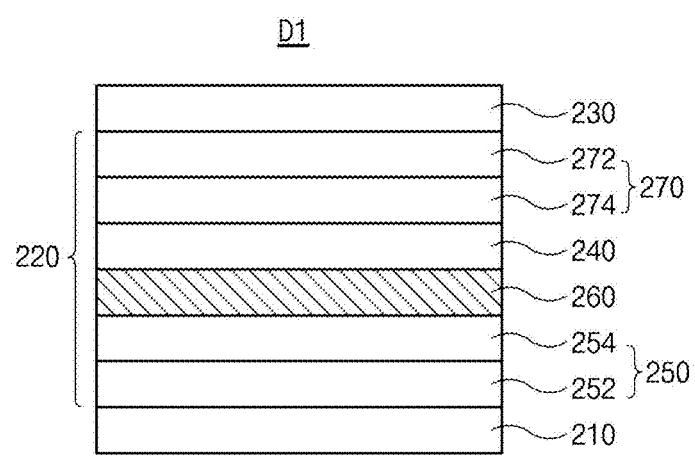
FIG. 2 is a schematic cross-section view illustrating an inorganic light emitting diode in accordance with an exemplary aspect of the present disclosure.

FIG. 2 is a cross-sectional view illustrating an inorganic light emitting diode (LED) in accordance with one exemplary aspect of the present disclosure. As illustrated in FIG. 2, the inorganic LED D1 comprises a first electrode 210, a second electrode 230 facing the first electrode 210 and an emissive layer 220 disposed between the first and second electrodes 210 and 230. The emissive layer 220 comprises an emitting material layer (EML) 240 disposed between the first and second electrodes 210 and 230. Also, the emissive layer 220 includes a first charge transfer layer (CTL1) 250 disposed between the first electrode and the EML 240, a second charge transfer layer (CTL2) 270 disposed between the EML 240 and the second electrode 230 and an energy control layer (ECL) 260 disposed between the CTL1 250 and the EML 240.

In this aspect, the first electrode 210 may be an anode such as a hole injection electrode. The first electrode 210 may be located over a substrate 110 (see, FIG. 1) that may be a glass or a polymer. As an example, the first electrode 210 may include, but is not limited to, a doped or undoped metal oxide such as ITO, IZO, ITZO, ICO, $SnO_2$, $In_2O_3$, Cd:ZnO, F:$SnO_2$, In:$SnO_2$, Ga:$SnO_2$ and AZO. Optionally, the first electrode 210 may include a metal or nonmetal material such as Ni, Pt, Au, Ag, Ir and CNT, other than the above-described metal oxide.

The second electrode 230 may be a cathode such as an electron injection electrode. As an example, the second electrode 230 may include, but is not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg. As an example, each of the first electrode 210 and the second electrode 230 may have a thickness of, but is not limited to, about 30 to about 300 nm.

In one exemplary aspect, when the inorganic LED D is a bottom emission-type LED, the first electrode 210 may include, but is not limited to, a transparent conductive metal oxide such as ITO, IZO, ITZO or AZO, and the second electrode 230 may include, but is not limited to, Ca, Ba, Ca/Al, LiF/Ca, LiF/Al, BaF2/Al, Al, Mg, or an Ag:Mg alloy.

The EML 240 may include inorganic luminescent particles such as quantum dots (QDs) or quantum rods (QRs). QDs or QRs are inorganic luminescent particles each of which emits light as unstable charge excitons shifts from the conduction band energy level to the valance band (VB) energy level. These inorganic luminescent particles have very large extinction coefficient, high quantum yield among inorganic particles and generates strong fluorescence. In addition, these inorganic luminescent particles emit at different luminescence wavelengths as its size, and it is possible to emit lights within the whole visible light spectra so as to implement various colors by adjusting sizes of these inorganic luminescent particles. When these inorganic luminescent particles such as QDs and/or QRs are used as a luminescence material in the EML 240, it is possible to enhance color purity in individual pixel region and to realize White (W) light consisting of red (R), green (G) and blue (B) light having high color purity.

In one exemplary aspect, the inorganic luminescent particles (ex. QDs or QRs) may have a single-layered structure. In another exemplary aspect, the inorganic luminescent particles may have a multiple-layered heterologous structure, i.e. core/shell structure. In this case, each of the core and the shell may have a single layer or multiple layers, respectively. The reactivity of precursors forming the core and/or shell, injection rates of the precursors into a reaction vessel, reaction temperature and kinds of ligands bonded to an outer surface of those inorganic luminescent particles such as QDs or QRs may have affects upon the growth degrees, crystal structures of those inorganic luminescent particles. As a result, it is possible to emit lights of various luminescent wavelength ranges, as the energy level bandgap of those inorganic luminescent particles are adjusted.

In one exemplary aspect, the inorganic luminescent particles (e.g. QDs and/or QRs) may have a type I core/shell structure where an energy level bandgap of the core is within an energy level bandgap of the shell. In case of using the type I core/shell structure, electrons and holes are transferred to the core and recombined in the core. Since the core emits light from exciton energies, it is possible to adjust luminance wavelengths by adjusting sizes of the core.

In another exemplary aspect, the inorganic luminescent particles (e.g. QDs and/or QRs) may have type II core/shell structure where the energy level bandgap of the core and the shell are staggered and electrons and holes are transferred to opposite directions among the core and the shell. In case of using the type II core/shell structure, it is possible to adjust luminescence wavelengths as the thickness and the energy bandgap locations of the shell.

In still another exemplary aspect, the inorganic luminescent particles (e.g. QDs and/or QRs) may have reverse type I core/shell structure where the energy level bandgap of the core is wider than the energy level bandgap of the shell. In case of using the reverse type I core/shell structure, it is possible to adjust luminescence wavelengths as thickness of the shell.

As an example, when the inorganic luminescent particle (e.g. QDs and/or QRs) has a type-I core/shell structure, the core is a region where luminescence substantially occurs, and a luminescence wavelength of the inorganic luminescent particle is determined as the sizes of the core. To achieve a quantum confinement effect, the core necessarily has a smaller size than the exciton Bohr radius according to material of the inorganic luminescent particle, and an optical bandgap at a corresponding size.

The shell of the inorganic luminescent particles (e.g. QDs and/or QRs) promotes the quantum confinement effect of the core, and determines the stability of the particles. Atoms exposed on a surface of colloidal inorganic luminescent particles (e.g. QDs and/or QRs) having only a single structure have lone pair electrons which do not participate in a chemical bond, unlike the internal atoms. Since energy levels of these surface atoms are between the conduction band edge and the valance band edge of the inorganic luminescent particles (e.g. QDs and/or QRs), the charges may be trapped on the surface of the inorganic luminescent particles (e.g. QDs and/or QRs), and thereby resulting in surface defects. Due to a non-radiative recombination process of excitons caused by the surface defects, the luminous efficiency of the inorganic luminescent particles may be degraded, and the trapped charges may react with external oxygen and compounds, leading to a change in the chemical composition of the inorganic luminescent particles, or to a permanent loss of the electrical/optical properties of the inorganic luminescent particles.

To effectively form the shell on the surface of the core, a lattice constant of the material in the shell needs to be similar to that of the material in the core. As the surface of the core is enclosed by the shell, the oxidation of the core may be prevented, the chemical stability of the inorganic luminescent particles (e.g. QDs and/or QRs) may be enhanced, and the photo-degradation of the core by an external factor such as water or oxygen may be prevented. In addition, the loss of excitons caused by the surface trap on the surface of the core may be minimized, and the energy loss caused by molecular vibration may be prevented, thereby enhancing the quantum efficiency.

In one exemplary aspect, each of the core and the shell may include, but is not limited to, a semiconductor nanocrystal and/or metal oxide nanocrystal having quantum confinement effect. For example, the semiconductor nanocrystal of the core and the shell may be selected from the group, but is not limited to, consisting of Group II-VI compound semiconductor nanocrystal, Group III-V compound semiconductor nanocrystal, Group IV-VI compound semiconductor nanocrystal, Group 1-III-VI compound semiconductor nanocrystal and combination thereof.

Particularly, Group II-VI compound semiconductor nanocrystal of the core and/or the shell may be selected from the group, but is not limited to, consisting of MgS, MgSe, MgTe, CaS, CaSe, CaTe, SrS, SrSe, SrTe, BaS, BaSe, BaTe, ZnS, ZnSe, ZnTe, ZnSeS, ZnTeSe, ZnO, CdS, CdSe, CdTe, CdSeS, CdZnS, CdSeTe, CdO, HgS, HgSe, HgTe, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and combination thereof. Group III-V compound semiconductor nanocrystal of the core and/or shell may be selected from the group, but is not limited to, consisting of AlN, AlP, AlAs, AlSb, GaN, GaP, GaAs, GaSb, InN, InP, InAs, InSb, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb and combination thereof.

Group IV-VI compound semiconductor nanocrystal of the core and/or shell may be selected from the group, but is not limited to, consisting of $TiO_2$, $SnO_2$, SnS, $SnS_2$, SnTe, PbO, $PbO_2$, PbS, PbSe, PbTe, PbSnTe and combination thereof. Also, Group 1-III-VI compound semiconductor nanocrystal of the core and/or shell may be selected from the group, but is not limited to, AgGaS$_2$, AgGaSe$_2$, AgGaTe$_2$, AgInS$_2$, CuInS$_2$, CuInSe$_2$, Cu$_2$SnS$_3$, CuGaS$_2$, CuGaSe$_2$ and combination thereof. Alternatively, each of the core and the shell may independently include multiple layers each of which has different Groups compound semiconductor nanocrystal, e.g., Group II-VI compound semiconductor nanocrystal and Group III-V compound semiconductor nanocrystal such as InP/ZnS, InP/ZnSe, GaP/ZnS, and the likes, respectively.

In another aspect, the metal oxide nanocrystal of the core and/or shell may include, but is not limited to, Group II or Group III metal oxide nanocrystal. As an example, the metal oxide nanocrystal of the core and/or the shell may be selected from the group, but is not limited to, MgO, CaO, SrO, BaO, Al$_2$O$_3$ and combination thereof.

The semiconductor nanocrystal of the core and/or the shell may be doped with a rare earth element such as Eu, Er, Tb, Tm, Dy or an arbitrary combination thereof or may be doped with a metal element such as Mn, Cu, Ag, Al or an arbitrary combination thereof.

As an example, the core in QDs or QRs may include, but is not limited to, ZnSe, ZnTe, CdSe, CdTe, InP, ZnCdS, CuxIn1-xS, CuxIn1-xSe, AgxIn1-xS and combination thereof. The shell in QDs or QRs may include, but is not limited to, ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, CdXZn1-xS and combination thereof.

In another exemplary aspect, the inorganic luminescent particle may include, but is not limited to, alloy QD or alloy QR such as homogenous alloy QD or QR or gradient alloy QD or QR, e.g. CdSxSe1-x, CdSexTe1-x, CdXZn1-xS, ZnxCd1-xSe, CuxIn1-xS, CuxIn1-xSe, AgxIn1-xS.

In another exemplary aspect, the inorganic luminescent particle may be QDs or QRs having a Perovskite structure. The inorganic luminescent particle such as The QDs or QRs of the Perovskite structure comprises a core as a luminescent component and optionally a shell. As an example, the core of the inorganic luminescent particle having the Perovskite structure may have the following structure of Chemical Formula 1:

  [Chemical Formula 1]

In Chemical Formula 1, A is an organic ammonium or alkali metal; B is a metal selected from the group consisting of divalent transition metal, rare earth metal, alkaline earth metal, Pb, Sn, Ge, Ga, In, Al, Sb, Bi, Po and combination thereof, and X is halogen selected from the group consisting of Cl, Br, I and combination thereof.

For example, when the A is an organic ammonium, the inorganic luminescent particle constitutes an inorganic-organic hybrid Perovskite structure. The organic ammonium may comprise, but is not limited to, amidinium-based organic ion, (CH$_3$NH$_3$)$_n$, ((C$_x$H$_{2x+1}$)$_n$NH$_3$)$_2$(CH$_3$NH$_3$)$_n$, (C$_n$H$_{2n+1}$NH$_3$)$_2$, (CF$_3$NH$_3$), (CF$_3$NH$_3$)$_n$, ((C$_x$F$_{2x+1}$)$_n$NH$_3$)$_2$ (CF$_3$NH$_3$)$_n$, ((C$_x$F$_{2x+1}$)$_n$NH$_3$)$_2$ and/or (C$_n$F$_{2n+1}$NH$_3$)$_2$) (each of n and x is independently an integer equal to or more than 1, respectively). More specifically, the organic ammonium may be methyl ammonium or ethyl ammonium.

In addition, the alkali metal of the A may comprise, but is not limited to, Na, K, Rb, Cs and/or Fr. In this case, the inorganic luminescent particle constitutes an inorganic metal Perovskite structure.

For example, when the core of the inorganic luminescent particle having Perovskite structure has the inorganic-organic hybrid Perovskite structure, the inorganic-organic hybrid Perovskite structure has a layered structure in which an inorganic plane in which a metal cation is located is sandwiched between organic planes in which the organic cations are located. In this case, since the difference between the dielectric constant of the organic and inorganic materials is large, exciton is constrained in the inorganic plane constituting the inorganic-organic hybrid Perovskite lattice structure, and thus has the advantage of emitting light having high color purity. Also, when the core of the inorganic luminescent particle having Perovskite structure is the inorganic-organic hybrid Perovskite structure, it may be advantageous in terms of material stability.

By adjusting the composition ratio of each component, the kind and composition ratio of halogen (X) atom in the core of the inorganic luminescent particle having the Perovskite structure, it is possible to synthesize the core emitting light in various wavelengths. In addition, unlike the cores constituting other QDs or QRs, the inorganic luminescent particle having Perovskite structure has a stable lattice structure, and thus luminous efficiency can be improved.

When the EML 240 includes inorganic luminescent particles such as QDs and/or QRs, the EML 240 may be disposed through soluble process, i.e. coating the dispersion solution which contains inorganic luminescent particles dissolved in a solvent, on the CTL1 250 and evaporating the solvent. The EML 240 may be laminated on the CTL1 250 using any soluble process such as spin coating, drop coating, dip coating, spray coating, roll coating, flow coating casting, screen printing and inkjet printing, or a combination thereof. As an example, the EML 240 may have a thickness of, but is not limited to, about 5 nm to about 300 nm, preferably about 10 nm to about 200 nm.

In one exemplary aspect, the EML 240 may include inorganic luminescent particles such as QDs and/or QRs having photoluminescence (PL) wavelength peaks of blue, green and red wavelength ranges so as to realize white LED. Optionally, the EML 240 may include inorganic luminescent particles such as QDs or QRs having any one of red, green and blue colors, and may be formed to emit any one color. As an example, the inorganic luminescent particles may emit red light of wavelength ranges between more than 580 nm and about 650 nm, and/or emit green light of wavelength ranges between about 500 nm and about 580 nm.

In this aspect, the CTL1 250 may be a hole transfer layer which provides holes with the EML 240. As an example, the CTL1 250 may include a hole injection layer (HIL) 252 disposed adjacently to the first electrode 210 between the first electrode 210 and the EML 240, and a hole transport layer (HTL) 254 disposed adjacently to the EML 240 between the first electrode 210 and the EML 240.

The HIL 252 facilitates the injection of holes from the first electrode 210 into the EML 240. As an example, the HIL 252 may include, but is not limited to, an organic material selected from the group consisting of poly(ethylenedioxythiophene):polystyrenesulfonate (PEDOT:PSS); 4,4',4''-tris (diphenylamino)triphenylamines (TDATA) doped with tetrafluoro-tetracyano-quinodimethane (F4-TCNQ); p-doped phthalocyanine such as zinc phthalocyanine (ZnPc) doped with F4-TCNQ; N,N'-diphenyl-N,N'-bis(1-naphthyl)-1,1'-biphenyl-4,4''-diamine (α-NPD) doped with F4-TCNQ; hexaazatriphenylene-hexanitrile (HAT-CN); and a combination thereof. As an example, the HIL 252 may include the dopant such as F4-TCNQ in about 1 to about 30% by weight. The HIL 252 may be omitted in compliance with a structure of the inorganic LED D1.

The HTL 254 transports holes from the first electrode 210 into the EML 240. The HTL 254 may include an inorganic material or an organic material. As an example, when the HTL 254 includes an organic material, the HTL 254 may include, but is not limited to, 4,4'-bis(p-carbazolyl)-1,1'-biphenyl compounds such as 4,4'-bis(N-carbazolyl)-1,1'-biphenyl (CBP) and 4,4'-Bis(9-carbazolyl)-2,2'-dimethylbiphenyl (CDBP); aromatic amines, i.e. aryl amines or polynuclear aromatic amines selected from the group consisting of α-NPD, N4,N4'-di(naphthalene-1-yl)-N4,N4'-bis(4-vinylphenyl)biphenyl-4,4'-diamine (VNPB), N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N,N'-diphenylbenzidine (DNTPD), N,N'-Bis(3-methylphenyl)-N,N'-bis(phenyl)-9,9'-dioctylfluorene (DOFL-TPD), N2,N7-Di(naphthalene-1-yl)-9,9-dioctyl-N2,N7-diphenyl-9H-fluorene-2,7-diamine (DOFL-NPB), N4,N4'-Bis(4-(6-((3-ethyloxetan-3-yl)methoxy)hexyl)phenyl)-N4,N4'-diphenylbiphenyl-4,4'-diamine (OTPD), 4,4',4"-tris(N-carbazolyl)-triphenylamine (TCTA), tetra-N-phenylbenzidine (TPB), tris(3-methylphenylphenylamino)-triphenylamine (m-MTDATA), poly(9,9'-dioctylfluorenyl-2,7-diyl)-co-(4,4'-(N-(4-sec-butylphenyl)diphenylamine (TFB), poly(4-butylphenyl-dipnehyl amine) (poly-TPD) and combination thereof; conductive polymers such as polyaniline, polypyrrole, PEDOTPSS; poly(N-vinylcarbazole) (PVK) and its derivatives; poly(para)phenylene vinylenes (PPV) and its derivatives such as poly[2-methoxy-5-(2-ethylhexyloxy)-1,4-phenylene vinylene] (MEH-PPV), poly[2-methoxy-5-(3',7'-dimethyloctyloxy)-1,4-phenylene vinylene] (MOMO-PPV); polymethacrylate and its derivatives; poly(9,9-octylfluorene) and its derivatives; poly(spiro-fluorene) and its derivatives; metal complexes such as copper phthalocyanine (CuPc); and combination thereof.

Alternatively, when the HTL 252 includes an inorganic material, the HTL 254 may comprise an inorganic material selected from the group consisting of a metal oxide nanocrystal, a non-oxide metal nanocrystal and combination thereof. The metal oxide nanocrystal that can be used in the HTL 254 may comprise an oxide nanocrystal of metal selected from Zn, Ti, Ni, Co, Cu, W, Sn, Cr, V, Mo, Mn, Pb, Ce, Re and combination thereof. For example, the metal oxide nanocrystal that can be used in the HTL 254 may be selected from, but is not limited to, the group consisting of $ZnO$, $TiO_2$, $CoO$, $CuO$, $Cu_2O$, $FeO$, $In_2O_3$, $MnO$, $NiO$, $PbO$, $SnOx$, $Cr_2O_3$, $V_2O_5$, $Ce_2O_3$, $MoO_3$, $Bi_2O_3$, $ReO_3$ and combination thereof. The non-oxide metal nanocrystal may comprise, but is not limited to, CuSCN, $Mo_2S$ and p-type GAN. The non-oxide metal nanocrystal that can be used in the HTL 254 may comprise, but is not limited to, CuSCN, $Mo_2S$ and p-type GAN.

Figure 4:
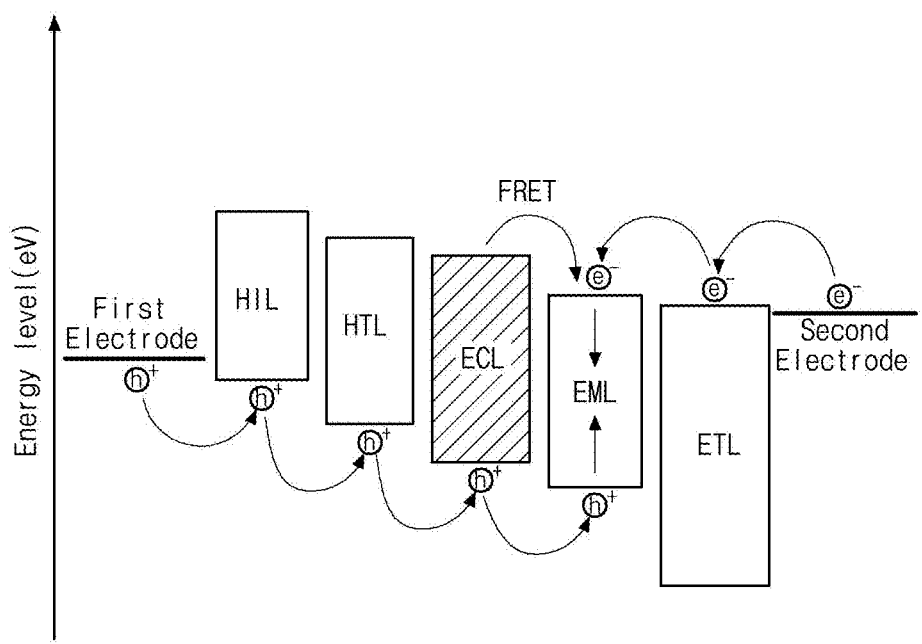
FIG. 4 is a schematic diagram illustrating HOMO and LUMO energy levels in an inorganic light emitting diode in accordance with an exemplary aspect of the present disclosure.

In this case, as illustrated in FIG. 4, the HOMO (Highest Occupied Molecular Orbital) energy level, corresponding to the VB energy level in case of inorganic material, of the HTL 254 should be shallower than the VB energy level of the EML 240 so that holes can be injected into the EML 240 efficiently. To this end, the HTL 254 may further comprise a component (p-dopant) p-doped with the metal oxide nanocrystals or the non-oxide nanocrystals. As an example, the p-dopant in the HTL 254 may comprise, but is not limited to, $Li^+$, $Na^+$, $K^+$, $Sr^+$, $Ni^{2+}$, $Mn^{2+}$, $Pb^{2+}$, $Cu^+$, $Cu^{2+}$, $CO^{2+}$, $Al^{3+}$, $Eu^{3+}$, $In^{3+}$, $Ce^{3+}$, $Er^{3+}$, $Tb^{3+}$, $Nd^{3+}$, $Y^{3+}$, $Cd^{2+}$, $Sm^{3+}$, N, P, As and combination thereof.

In FIG. 2, while the CTL1 250 is divided into the HIL 252 and the HTL 254, the CTL1 250 may have a mono-layered structure. For example, the CTL1 250 may include only the HTL 254 without the HIL 252 or may include the above-mentioned hole transporting material doped with the hole injection material (e.g. PEDOT:PSS).

The CTL1 250 including the HIL 252 and the HTL 254 may be laminated by any vacuum deposition process such as vacuum vapor deposition and sputtering, or by any soluble process such as spin coating, drop coating, dip coating, spray coating, roll coating, flow coating, casting, screen printing and inkjet printing, or a combination thereof. For example, each of the HIL 252 and the HTL 254 may have a thickness, but is not limited to, between about 10 nm and 200 nm, alternatively, about 10 nm and 100 nm.

The ECL 260 is disposed between the CTL1 250 as the hole transfer layer and the EML 240. The ECL 260 disposed adjacently to the EML 240 transfer exciton energy to the inorganic luminescent particles in the EML 240 via FRET (Forster Resonance Energy Transfer) mechanism. Also, the ECL 260 prevents light emission at an interface between the CTL1 250 and the EML 240 and controls to occur only the light emission by the inorganic luminescent particles. In other words, the ECL 260 between the CTL1 250 and the EML 240 controls the interfacial light emission between the EML 240 and the CTL1 250, and transfers fluorescent energies to the inorganic luminescent particles in the EML 240, thus improves the color purity and luminous efficiency of the light emitted from the EML 240.

The ECL 260 comprises an organometallic compound interacting with a hydroxyquinoline moiety. In one exemplary aspect, the organometallic compound may comprise a metal complex coordinated with the hydroxyquinoline moiety, i.e. a hydroxyquinoline ligand. In another exemplary aspect, the organometallic compound may comprise an ionic metal compound including a metal component interacting with the hydroxyquinoline moiety. For example, a metal component of the organometallic compound, such as the metal coordinated with the hydroxyquinoline moiety in the metal complex or the metal component interacting with the hydroxyquinoline moiety in the ionic metal compound, may comprise, but is not limited to, lithium (Li), magnesium (Mg), aluminum (Al), copper (Cu), zinc (Zn), beryllium (Be), erbium (Er) and cation thereof.

As an example, the organometallic compound including lithium or lithium ion interacting with the hydroxyquinoline moiety may comprise, but is not limited to, (8-hydroxyquinolinato) lithium (Liq), (2-methyl-8-hydroxyquinolinato) lithium (LiMeq) and combination thereof. The organometallic compound including magnesium or magnesium ion interacting with the hydroxyquinoline moiety may comprise, but is not limited to, bis(hydroxyquinolinato) magnesium ($Mgq_2$), bis(5-chloro-8-hydroxyquinolinato) magnesium ($MgClq_2$) and combination thereof.

The organometallic compound including aluminum or aluminum ion interacting with the hydroxyquinoline moiety may comprise, but is not limited to, tris(8-hydroxyquinolinato) aluminum ($Alq_3$), bis(8-hydroxy-2-methylquinoline)-(4-phenylphenoxy) aluminum (BAlq), bis(2-methyl-8-hydroxyquinolinato) aluminum hydroxide ($AlMg_2H$), tris(5,7-dichloro-8-hydroxyquinolinato) aluminum ($Al(Cl_2q)_3$), tris(5-methyl-8-hydroxyquinolinato) aluminum ($Al(Meq)_3$), bis(2-amino-8-hydroxyquinolato)acetylaceto aluminum (III) ($Al(NH_2q_2)acac$) and combination thereof. The organometallic compound including copper or copper ion interacting with the hydroxyquinoline moiety may comprise, but is not limited to, bis(hydroxyquinolinato) copper ($Cuq_2$).

Also, the organometallic compound including zinc or zinc ion interacting with the hydroxyquinoline moiety may comprise, but is not limited to, bis(hydroxyquinolinato) zinc ($Znq_2$), bis(5-chloro-8-hydroxyquinolinato) zinc (($5Clq)_2Zn$), bis(5,7-dichloro-8-hydroxyquinolinato) zinc ($Zn(Cl_2q)_2$), bis(5,7-dimethyl-8-hydroxyquinolinato) zinc ((Me₂q)₂Zn), [2-(2-hydroxyphenyl)benzoxazole (8-hydroxyquinolie)] zinc (Zn(HPB)q) and combination thereof. The organometallic compound including beryllium or beryllium ion interacting with the hydroxyquinoline moiety may comprise, but is not limited to, bis(hydroxyquinolinato) beryllium (Beq₂), bis(5,7-dimethyl-8-hydroxyquinolinato) beryllium (Be(Me₂q)₂) and combination thereof. In addition, the organometallic compound including erbium or erbium ion interacting with the hydroxyquinoline moiety may comprise, but is not limited to, tris(8-hydroxyquinolinato) erbium (III) (Erq₃).

In one exemplary aspect, the organometallic compound in the ECL 260 may comprise, but is not limited to, (8-hydroxyquinolinato) lithium (Liq), bis(hydroxyquinolinato) copper (Cuq₂), bis(hydroxyquinolinato) zinc (Znq₂), bis(hydroxyquinolinato) magnesium (Mgq₂), tris(8-hydroxyquinolinato) aluminum (Alq₃), bis(8-hydroxy-2-methylquinoline)-(4-phenylphenoxy) aluminum (BAlq), tris(8-hydroxyquinolinato) erbium (III) (Erq₃) and combination thereof. The following Chemical Formula 2 illustrates a structure of a part of the organometallic compound interacting with the hydroxyquinoline moiety and applicable into the ECL 260.

[Chemical Formula 2]

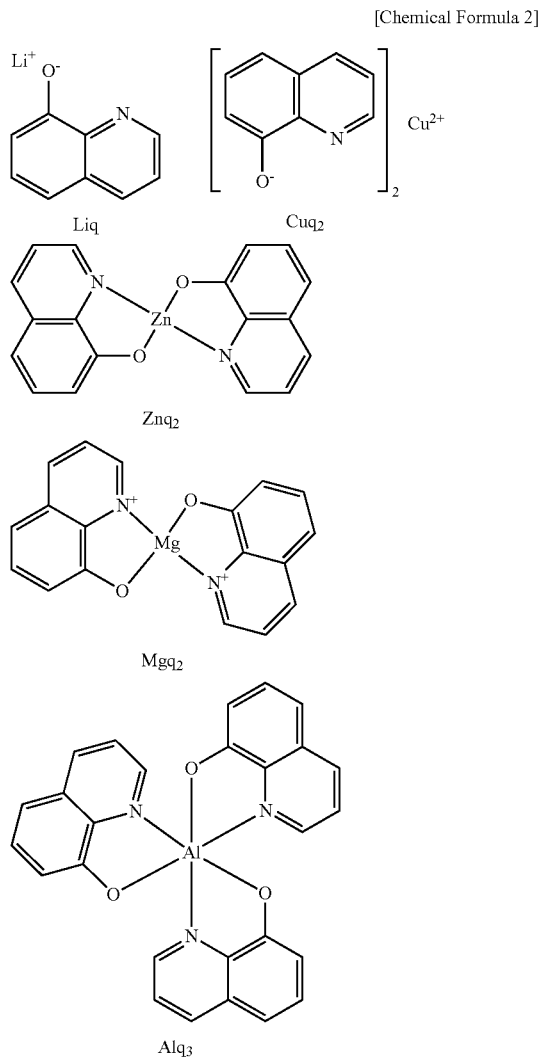

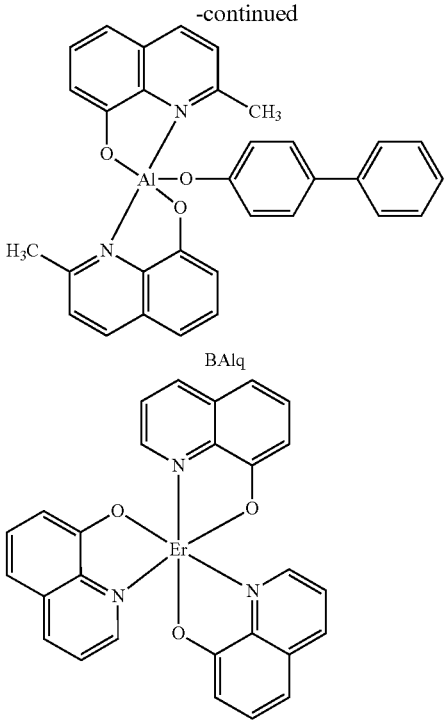

The CTL2 270 is disposed between the EML 240 and the second electrode 230. The CTL2 270 may be an electron transfer layer which provides electrons into the EML 240. In one exemplary aspect, the CTL2 270 may include an electron injection layer (EIL) 272 disposed adjacently to the second electrode 230 between the second electrode 230 and the EML 240, and an electron transport layer (ETL) 274 disposed adjacently to the EML 240 between the second electrode 230 and the EML 240.

The EIL 272 facilitates the injection of electrons from the second electrode 230 into the EML 240. For example, the EIL 272 may include, but is not limited to, a metal such as Al, Cd, Cs, Cu, Ga, Ge, In and/or Li, each of which is undoped or doped with fluorine; and/or metal oxide such as $TiO_2$, ZnO, $ZrO_2$, $SnO_2$, $WO_3$ and/or $Ta_2O_3$, each of which is undoped or doped with Al, Mg, In, Li, Ga, Cd, Cs or Cu.

The ETL 274 transfers electrons into the EML 240. In one exemplary aspect, when the EML 240 includes inorganic luminescent particles, the ETL 274 may include an inorganic material so as to prevent an interface defect from being formed at an interface between the EML 240 and the ETL 274, and thereby securing driving stability of the inorganic LED D1. In addition, when the ETL 274 includes an inorganic material having high charge mobility, the electron transport rate provided from the second electrode 230 may be improved, and electrons can be transported efficiently into the EML 240 owing to high electron levels or concentrations.

In one exemplary aspect, the ETL 274 may include an inorganic material having relatively deep VB energy level (see, FIG. 4). Particularly, an inorganic material having wide energy bandgap $E_g$ between the VB energy level and the conduction band (CB) energy level may be used in the ETL 274. In this case, electrons provided from the second electrode 230 can be injected efficiently to the EML 240 through the ETL 272.

In one exemplary aspect, the ETL 274 may include an inorganic material selected from the group consisting of a metal oxide nanocrystal, a semiconductor nanocrystal, a nitride and combination thereof, preferably the ETL 274 may include a metal oxide nanocrystal.

The metal oxide nanocrystal that can be used in the ETL 274 may comprise an oxide of metal selected from Zn, Ca, Mg, ti, Sn, W, Ta, Hf, Al, Zr, Ba and combination thereof. More particularly, the metal oxide in the ETL 274 may comprise, but is not limited to, $TiO_2$, ZnO, ZnMgO, ZnCaO, $ZrO_2$, $SnO_2$, SnMgO, $WO_3$, $Ta_2O_3$, $HfO_3$, $Al_2O_3$, $BaTiO_3$, $BaZrO_3$ and combination thereof. The semiconductor nanocrystal in the ETL 274 may comprise, but is not limited to, CdS, ZnSe and ZnS, and the nitride in the ETL 274 may comprise, but is not limited to $Si_3N_4$.

In one exemplary aspect, as illustrated in FIG. 4, the ETL 274 may be designed to have the LUMO (or CB) energy level substantially equal to the LUMO energy level of the EML 240 while the HOMO (or VB) energy level deeper than the HOMO energy level of the EML 240. To this end, the ETL 274 may further comprise a component (n-dopant) doped with the inorganic nanocrystal. The n-dopant that can be included in the ETL 274 may comprise, but is not limited to, metal cation such as Al, Mg, In, Li, Ga, Cd, Cs, Cu and the like, particularly trivalent cation.

In an alternative aspect, when the ETL 274 comprises an organic material, the ETL 274 may comprise, but is not limited to, oxazole-based compounds, isoxazole-based compounds, triazole-based compounds, isotriazole-based compounds, oxadiazole-based compounds, thiadiazole-based compounds, phenanthroline-based compounds, perylene-based compounds, benzoxazole-based compounds, benzothiazole-based compounds, benzimidazole-based compounds, triazine-based compounds and aluminum complexes.

More particularly, the organic material in the ETL 274 may comprise, but is not limited to, 3-(4-Biphenyl)-4-phenyl-5-tert-butylphenyl-1,2,4-triazole (TAZ), 2,9-Dimethyl-4,7-diphenyl-1,10-phenaathroline (bathocuproine, BCP), 1,3,5-benzinetriyl)-tris(1-phenyl-1-H-benzimidazole (TPBi), $Alq_3$, BAlq, bis(2-methyl-quinolinato)(tripnehylsiloxy) aluminum (III) (Salq) and combination thereof.

Similar to the CTL1 250, while FIG. 2 illustrates the CTL2 270 as a bi-layered structure including the EIL 272 and the ETL 274, the CTL2 270 may have a mono-layered structure having only the ETL 274. Alternatively, the CTL2 270 may have a mono-layered structure of ETL 274 including a blend of the above-described electron-transporting inorganic material with cesium carbonate.

The CTL2 270, which includes the EIL 272 and/or the ETL 274, may be disposed on the EML 240 by any vacuum deposition process such as vacuum vapor deposition and sputtering, or soluble process such as spin coating, drop coating, dip coating, spray coating, roll coating, flow coating, casting, screen printing and inkjet printing, or combination thereof. As an example, each of the EIL 272 and the ETL 274 may have a thickness, but is not limited to, between about 10 nm and about 200 nm, alternatively, about 10 nm and 100 nm.

For example, the inorganic LED D1 may have a hybrid CTL structure in which the HTL 254 of the CTL1 250 includes the organic material as describe above and the CTL2 270, for example, the ETL 274 includes the inorganic material as described above. In this case, The inorganic LED D1 may enhance its luminous properties.

Figure 3:
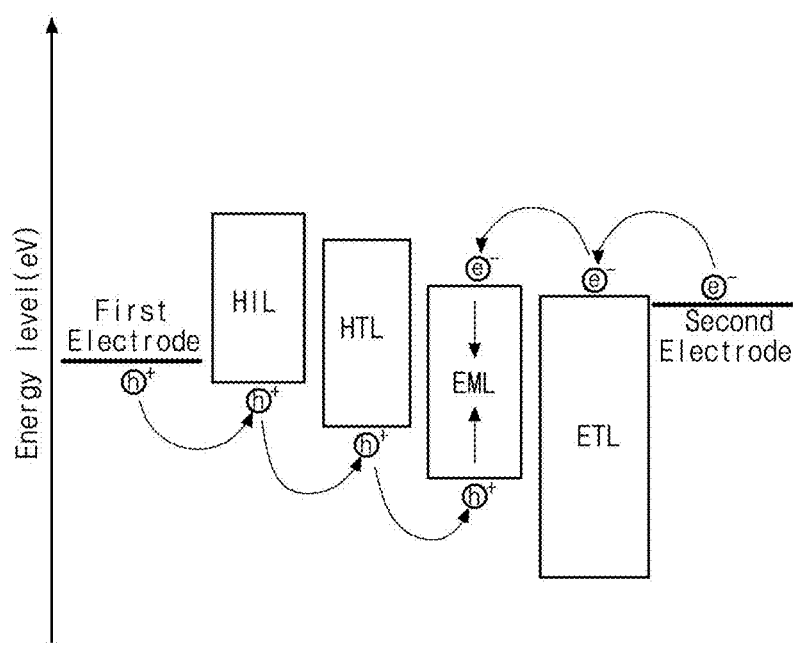
FIG. 3 is a schematic diagram illustrating HOMO and LUMO energy levels in conventional inorganic light emitting diode.

Now, we will explain the functions and roles of the ECL 260 disposed between the hole transfer layer, such as the HTL 254, and the EML and includes the organometallic compound interacting with the hydroxyquinoline moiety at the hand of FIGS. 3 and 4. FIG. 3 is a schematic diagram illustrating HOMO (or VB) and LUMO (or CB) energy levels in conventional inorganic light emitting diode. FIG. 4 is a schematic diagram illustrating HOMO and LUMO energy levels in an inorganic light emitting diode in accordance with an exemplary aspect of the present disclosure.

As illustrated in FIG. 3, holes generated at the first electrode are injected into the EML 240 through the HIL 252 and the HTL 254. Electrons generated at the second electrode are injected into the EML 240 through the ETL 274. Holes and electrons injected into the EML 240 are recombined to form excitons, and the inorganic LED D1 can emit light with converting exciton energy to light energy while the exciton energy shifts from the exciton energy shifts from the excited state to the ground state When the ETL 274 includes an inorganic material such as metal oxide nanocrystals, the transport and injection velocity of the electrons is faster than the transport and injection velocity of the holes. The exciton recombination zone among holes and electrons are formed at an interface between the EML 240 and the ETL 274, not the central region of the EML 240. In the conventional inorganic LED without disposing the ECL 260, in addition to the luminescent peak of the inorganic luminescent particles in the EML 240, additional luminescent peak of wavelength ranges different from the peak of the inorganic luminescent particles is generated. As plural peaks having different wavelength ranges are generated, the conventional inorganic LED shows deteriorated color purity. In addition, the EML 240 including the inorganic luminescent particles shows very low luminous efficiency compared to the luminous efficiency of the EML in the OLED.

On the other hand, as illustrated in FIG. 4, in the inorganic LED D1 in the first aspect of the present disclosure, the ECL 260 disposed between the HTL 254 and the EML 240 transfers fluorescent energies to the EML 240 via FRET mechanism. As the phosphorescent energies are transferred to the EML 240 from the ECL 260, the exciton recombination zone is formed in the central region of the EML 240. Accordingly, the inorganic LED D1 shows improved color purity without any luminescence peak other than the luminescence peak emitted from the inorganic luminescent particles in the EML 240. In addition, the inorganic LED D1 improves its luminous efficiency due to the fluorescent energies transferred from the ECL 260.

In one exemplary aspect, the ECL 260 may have a thickness of, but is not limited to, about 1 nm to about 10 nm, for example, about 3 nm to about 5 nm, so that the organometallic compound interacting with the hydroxyquinoline moiety in the ECL 260 can transfer efficiently the fluorescent energies to the inorganic luminescent particles in the EML 240 via FRET mechanism. The The ECL 260 including the organometallic compound interacting with the hydroxyquinoline moiety may be disposed on the HTL 254 by a soluble process such as spin coating, drop coating, dip coating, spray coating, roll coating, flow coating, casting, screen printing and inkjet printing, or combination thereof.

In addition, the organometallic compound interacting with the hydroxyquinoline moiety may have a photoluminescence (PL) spectrum having large overlapping region with an absorption (Abs.) spectrum of the inorganic luminescent particles in the EML 240 so that the fluorescent energy can be efficiently transferred from the ECL 260 to the EML 240 by FRET mechanism.

In one exemplary aspect, a red inorganic luminescent particle has a maximum absorption peak between about 590 nm and about 620 nm, and a green inorganic luminescent particle has a maximum absorption peak between about 480 nm and about 510 nm. In this case, the organometallic compound interacting with the hydroxyquinoline moiety in the ECL 260 may have a maximum photoluminescence peak, but is not limited to, between about 470 nm and about 550 nm.

The organometallic compound in the energy control layer transfer energy to the inorganic luminescent particle in the EML by FRET (Forster resonance energy transfer) mechanism. The exciton recombination zone among holes and electrons are shifted to the central region in the EML, thus other photoluminescence peaks except the photoluminescence peak by the inorganic luminescent particle are not formed and the LED can improve its color purity. In addition, as the organometallic compound in the energy control layer is dissociated and the dissociated metal component and/or organic component fill the vacancy on the surface of the inorganic luminescent particles, and minimize the surface defects on the inorganic luminescent particles replacing the organic ligand detached from the inorganic luminescent particles. The inorganic luminescent particle can maintain its luminous efficiency, thus the inorganic light emitting diode can maximize its luminous efficiency.

Figure 5:
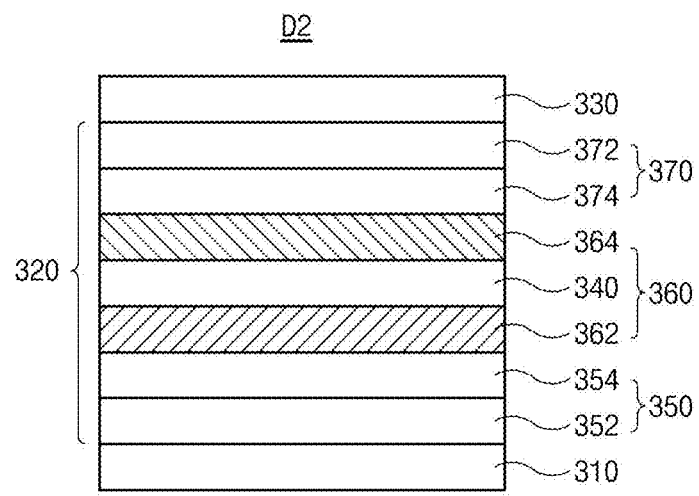
FIG. 5 is a schematic cross-sectional view illustrating an inorganic light emitting diode in accordance with another exemplary aspect of the present disclosure.
Figure 6:
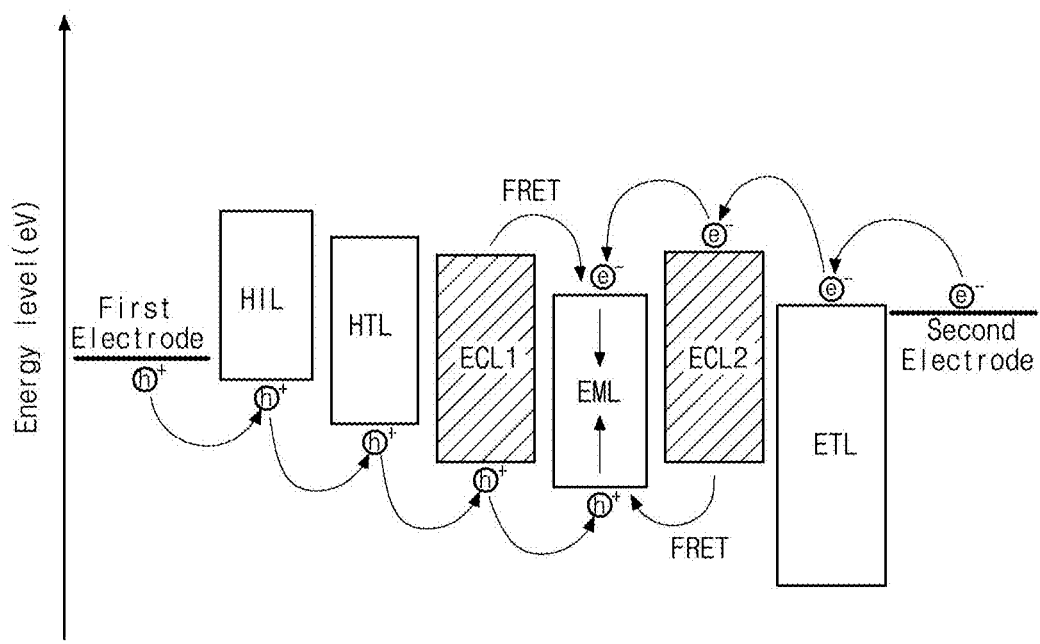
FIG. 6 is a schematic diagram illustrating HOMO and energy levels in an inorganic light emitting diode in accordance with another exemplary aspect of the present disclosure.

In the above first aspect, the inorganic LED D1 includes only one ECL between the EML and the hole transfer layer. The inorganic LED may have plural ECLs disposed adjacently to the EML. FIG. 5 is a schematic cross-sectional view illustrating an inorganic light emitting diode in accordance with another exemplary aspect of the present disclosure. FIG. 6 is a schematic diagram illustrating HOMO and energy levels in an inorganic light emitting diode in accordance with another exemplary aspect of the present disclosure.

As illustrated in FIG. 5, the inorganic LED D2 includes a first electrode 310, a second electrode 330 facing the first electrode 310 and an emissive layer 320 disposed between the first and second electrodes 310 and 330. The emissive layer 320 comprises an EML 340, a CTL1 350 disposed between the first electrode 310 and the EML 340 and a CTL2 370 disposed between the EML 340 and the second electrode 330. In addition, the emissive layer 320 includes two ECLs 362 and 364. More particularly, the ECL 360 includes a first ECL (ECL1) 362 disposed between the CTL1 350 and the EML 340 and a second ECL (ECL2) 364 disposed between the EML 340 and the CTL2 370. The configuration of the first and second electrodes 310 and 320, and the emissive layer 320 except the ECL 360 may be substantially identical to corresponding elements in D1.

Each of the ECL1 362 and the ECL2 364 can transfer exciton energies to the inorganic luminescent particles in the EML 340 via FRET mechanism. Particularly, the ECL1 362 prevents an interfacial luminescence between the EML 240 and the hole transfer layer, the CTL1 350 and transfer fluorescent energies to the inorganic luminescent particles in the EML 240 so that color purity and luminous efficiency emitted from the EML 340 can be improved. On the other hand, the ECL2 364 minimizes the surface defects on the inorganic luminescent particles in the EML 240 so that the inorganic luminescent particles can maximize its luminous efficiency.

Each of the ECL1 362 and the ECL2 364 may include independently the organometallic compound interacting with the hydroxyquinoline moiety, such as the metal complex coordinated with the hydroxyquinoline ligand and the ionic metal compound having the metal component interacting with the hydroxyquinoline moiety. For example, a metal component of the organometallic compound, may comprise, but is not limited to, lithium (Li), magnesium (Mg), aluminum (Al), copper (Cu), zinc (Zn), beryllium (Be), erbium (Er) and cation thereof. The organometallic compound in each of the ECL1 362 and the ECL2 362 may be the same as the organometallic compound in the ECL 260. For example, the organometallic compound in each of the ECL1 362 and the ECL2 364 may independently comprise, but is not limited to, Liq, LiMeq, Mgq$_2$, MgClq$_2$, Alq$_3$, BAlq, AlMg$_2$H, Al(Cl$_2$q)$_3$, Al(Meq)$_3$, Al(NH$_2$q$_2$)acac, Cuq$_2$, Znq$_2$, (5Clq)$_2$Zn, Zn(Cl$_2$q)$_2$, (Me$_2$q)$_2$Zn, Zn(HPB)q, Beq$_2$, Be(Me$_2$q)$_2$, Erq$_3$ and combination thereof.

In one exemplary aspect, ECL1 362 may acts mainly as transferring fluorescent energies to the inorganic luminescent particles in the EML 340. In this case, the ECL1 362 may comprise the organometallic compound having the PL spectrum with large overlapping area with the absorption spectrum of the inorganic luminescent particles in the EML 340.

On the other hand, the ECL2 364 may comprise the organometallic compound having relatively less bonding energies between the metal component and the hydroxyquinoline moiety so that it can be dissociated into a metal cation and a hydroxyquinoline anion. In this case, the organometallic compound in the ECL2 364 may be dissociated and isolated into the metal cation and the hydroxyquinoline moiety having negative charges.

The structure of the component constituting the inorganic luminescent particles, particularly the lattice structure of the metal component in the shell may be disrupted to generate vacancy during the purification process of the inorganic luminescent particles or fabricating the inorganic luminescent particles into a thin film. When the inorganic luminescent particles having such defect sites form the EML 340, the excitons by recombining holes and electrons injected from the first and second electrodes 310 and 330 are not involved in the luminescence process, but is trapped in the defect site of the inorganic luminescent particles to be quenched.

In addition, some ligands bonded on the surface of the inorganic luminescent particles detached from the particles, the surface of the inorganic luminescent particles is exposed. The inorganic luminescent particles having disrupted lattice structure or exposed surface are deteriorated by oxygen and/or moisture, thus the inorganic luminescent particles having surface defect shows extremely reduced quantum efficiency.

On the contrary, the metal ion dissociated from the organometallic compound in the ECL2 364 may fill the vacancy on the inorganic luminescent particles so that it can minimize the defects in the lattice structure of the inorganic luminescent particles. In addition, the negatively-charged hydroxyquinoline moiety in the ECL2 364 interact with the positively-charged surface of the inorganic luminescent particles, thus the negatively-charged hydroxyquinoline moiety can bind to the surface of the inorganic luminescent particles as it interacts with the ligand-detached luminescent particles. In other words, the ECL2 364 minimizes the surface defects on the inorganic luminescent particles in the EML 240 disposed adjacently to the ECL2 364, thus the inorganic luminescent particles can further improve its luminous efficiency.

In one exemplary aspect, the organometallic compound in the ECL2 364 may comprise material having less total binding energy between the metal component and the hydroxyquinoline moiety. For example, the organometallic compound in the ECL2 364 may comprise, but is not limited to, a metal complex or an ionic metal compound having 2 to 4 bonds or interactions between the metal component and the hydroxyquinoline moiety such as Liq, $Cuq_2$, $Znq_2$ and $Mgq_2$.

In one exemplary aspect, the organometallic compound in the ECL1 362 may include material having PL spectrum with large overlapping area with the absorption spectrum of the inorganic luminescent particles in the EML 340 and the organometallic compound in the ECL2 364 may include material having less total binding energy between the metal component and the hydroxyquinoline moiety. For example, the organometallic compound in the ECL1 362 may be the same as the organometallic compound in the ECL2 364. Alternatively, the organometallic compound in the ECL1 362 may be different from the organometallic compound in the ECL2 364.

Experimental Example 1: Measurement of PL Spectra in ECL and QD Abs. Spectra

Figure 7:
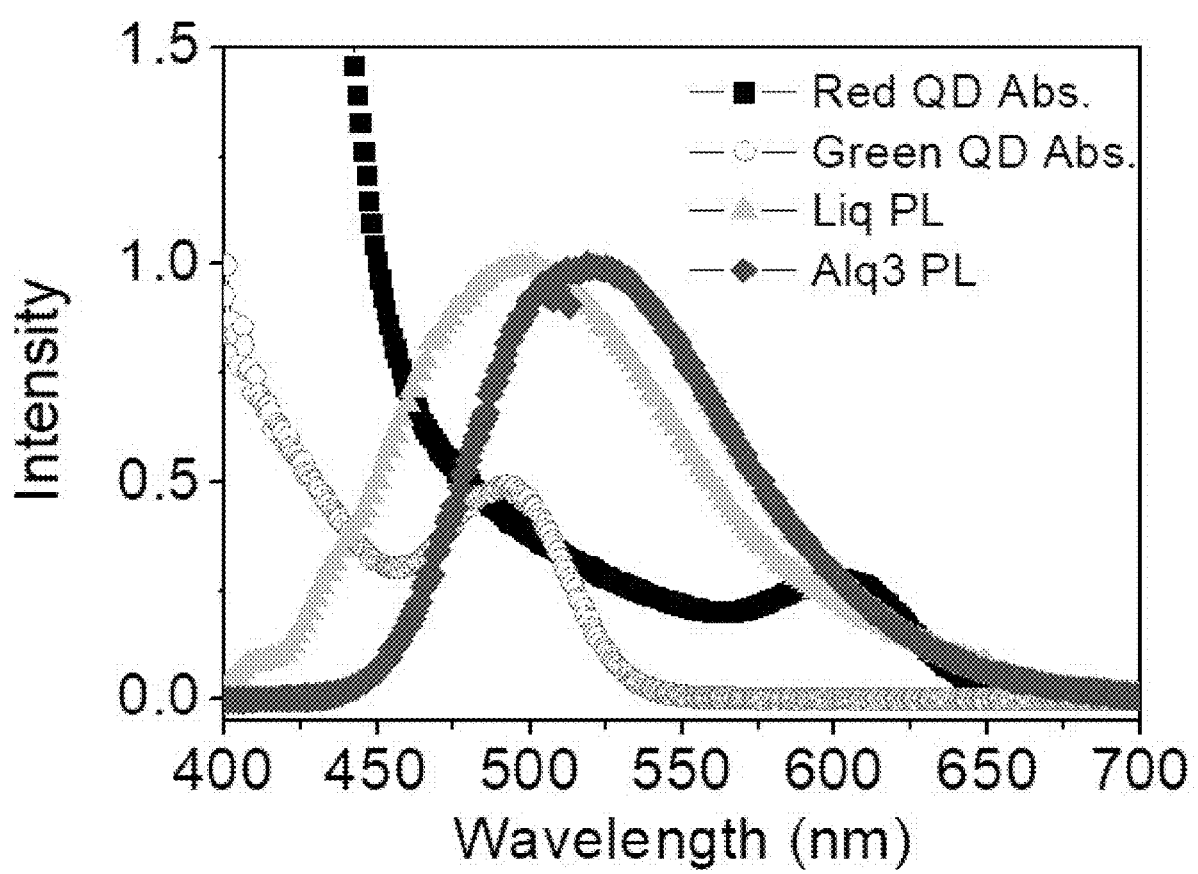
FIG. 7 is a graph illustrating photoluminescence (PL) spectra of organometallic compounds and Absorption (Abs.) spectra of inorganic luminescent particles in accordance with Examples.

Photoluminescence (PL) spectra of organometallic compound including a metal component interacting with hydroxyquinoline introduced into an energy control layer and absorption (Abs.) spectra of InP, which is the core of red and green quantum dots applicable into an EML, were measured. Table 1 below indicates maximum PL peaks of the organometallic compound including the metal compound interacting with hydroxyquinoline and FIG. 7 illustrates PL spectra of the organometallic compounds applicable into the energy control layer and Abs. spectra of InP, the core of red and green quantum dots. As indicated in Table 1 and FIG. 7, the organometallic compounds interacting with hydroxyquinoline have PL spectra overlapped with the Abs. spectra of the core of the red and green quantum dot. It was confirmed that the exciton energy can be transferred from the organometallic compound interacting with hydroxyquinoline to the quantum dot core by FRET mechanism.

TABLE 1

Maximum PL Peak of the Organometallic compound having Hydroxyquinoline Ligand

| Organometallic compound | Maximum PL peak (nm) |
|---|---|
| Liq | 500 |
| $Alq_3$ | 520 |
| $Znq_2$ | 500 |
| $Mgq_2$ | 483 |
| BAlq | 480 |

Example 1 (Ex. 1): Fabrication of Red QLED

A red QLED in which an EML includes a red quantum dot (InP/ZnSe) and an energy control layer (ECL) including Liq was disposed between an HTL and the EML was fabricated. An ITO (50 nm)-glass was patterned to have luminous area 3 mm×3 mm and washed. And an emissive layer and cathode were laminated as the following order:

A HIL (PEDOT:PSS, 25 nm); a HTL (TFB, 25 nm); an ECL (Liq, 5 nm); an EML (INP/ZnSe, 10 nm); an ETL (ZnMgO, 50 nm); and a cathode (Al, deposition at a rate of 15 nm/s under $1.0 \times 10^{-6}$ torr, 80 nm).

After depositing the cathode, The QLED was transferred from the vacuum chamber to a dry box for film formation, followed by encapsulation using UV-curable epoxy and moisture getter.

Example 2 (Ex. 2): Fabrication of Red QLED

A red QLED was fabricated using the same materials as Example 1, except further disposing second ECL (Liq, 5 nm) between the EML and the ETL.

Examples 3-4 (Ex. 3-4): Fabrication of Red QLED

A red QLED was fabricated using the same materials as Example 2, except modifying the thickness of the second ECL to 3 nm (Ex. 3) or to 10 nm (Ex. 4).

Example 5 (Ex. 5): Fabrication of Red QLED

A red QLED was fabricated using the same materials as Example 3, except using $Alq_3$ in the first ECL instead of Liq.

Example 6 (Ex. 6): Fabrication of Red QLED

A red QLED was fabricated using the same materials as Example 5, except using $Alq_3$ in the second ECL instead of Liq.

Comparative Example 1 (Ref 1): Fabrication of Red QLED

A red QLED was fabricated using the same materials as Example 1, except without disposing the ECL.

Experimental Example 2: Evaluation of Luminous Properties of Red QLED

Figure 8:
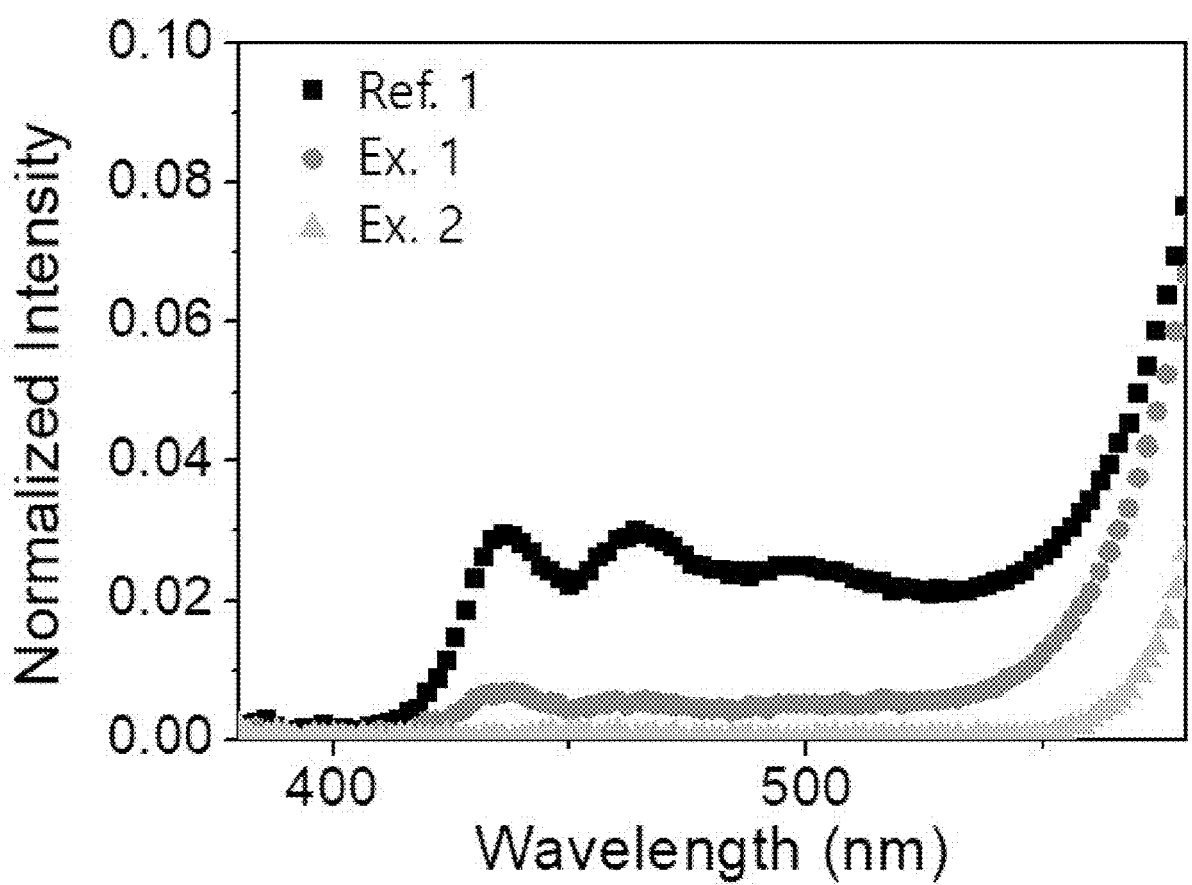
FIG. 8 is a graph illustrating normalized electroluminescence (EL) intensity of an inorganic light emitting diode fabricated in accordance with Examples.

Each of the QLED fabricated in Ex. 1 to 6 and Ref. 1 was connected to an external power source and then luminous properties for all the diodes were evaluated using a constant current source (KEITHLEY) and a photometer PR650 at room temperature. In particular, driving voltage and external quantum efficiency (EQE, %) at a current density of 10 mA/cm² as well as electroluminescence (EL) spectra by the wavelength of the QLEDs were measured. The measurement results are shown in the following Table 2 and FIG. 8.

TABLE 2

Luminous Property of Red QLED

| Sample | Emissive Layer Structure | V | EQE (%) |
|---|---|---|---|
| Ref. 1 | HTL/EML(QD)/ETL | 3.0 | 1.95 |
| Ex. 1 | HTL/ECL(Liq)/EML(QD)/ETL | 3.1 | 2.82 |
| Ex. 2 | HTL/ECL1(Liq)/EML(QD)/ECL2(Liq, 5 nm)/ETL | 3.2 | 2.90 |
| Ex. 3 | HTL/ECL1(Liq)/EML(QD)/ECL2(Liq, 3 nm)/ETL | 3.0 | 2.99 |
| Ex. 4 | HTL/ECL1(Liq)/EML(QD)/ECL2(Liq, 10 nm)/ETL | 4.7 | 2.04 |
| Ex. 5 | HTL/ECL1($Alq_3$)/EML(QD)/ECL2(Liq, 3 nm)/ETL | 3.0 | 3.24 |
| Ex. 6 | HTL/ECL1($Alq_3$)/EML(QD)/ECL2($Alq_3$, 3 nm)/ETL | 3.0 | 3.15 |

As indicated in Table 2, compared to the QLED in which any ECL was not introduced in Ref. 1, the QLEDs which introduce at least one ECL having the organometallic compound interacting with hydroxyquinoline in the emissive layer in Ex. 1 to 6 showed substantially equivalent driving voltages except the Ex. 4, and improved their EQE up to 66.2%. Particularly, compared to the QLEDs in Ex. 2 to Ex.

4, as the second ECL between the EML and the ETL has a thickness thinner than the thickness of the first ECL, the driving voltage was lowered and EQE was improved. Also, compared to Ex. 3 to Ex. 5, the overlapping region between the PL spectrum of $Alq_3$ and the absorption spectrum of the red quantum dot is larger than the overlapping region between the PL spectrum of Liq and the absorption spectrum of the red quantum dot (see, FIG. 7), thus FRET efficiency from Alq3 to the red quantum dot is improved, and the QLED in Ex. 5 has much improved luminous efficiency than the QLED in Ex. 3. On the other hand, when two ECLs made of $Alq_3$ on both sides of EML were introduced as in Ex. 6, its EQE is slightly reduced. Since Liq of ECL2 in Ex. 5 has a smaller bonding energy in the molecule than $Alq_3$ of ECL2 in Ex. 6, Liq is much efficient in protecting the quantum dot in the EML than $Alq_3$.

Example 7 (Ex. 7): Fabrication of Green QLED

A green QLED was fabricated using the same materials as Example 1, except using green quantum dot (InP/ZnSe) in the EML instead of the red quantum dot and modifying the thickness of the HTL to 40 nm, the thickness of the EML to 20 nm and the thickness of the ETL to 30 nm.

Example 8 (Ex. 7): Fabrication of Green QLED

A green QLED was fabricated using the same materials as Example 7, except further disposing a second ECL (Liq, 3 nm) between the EML and the ETL.

Example 9 (Ex. 9): Fabrication of Green QLED

A green QLED was fabricated using the same materials as Example 8, except using $Alq_3$ in the first ECL instead of Liq.

Example 10 (Ex. 10): Fabrication of Green QLED

A green QLED was fabricated using the same materials as Example 9, except using $Alq_3$ in the second ECL instead of Liq.

Comparative Example 2 (Ref. 2): Fabrication of Green QLED

A Green QLED was fabricated using the same materials as Example 7, except without disposing the ECL.

Experimental Example 3: Evaluation of Luminous Properties of Green QLED

Luminous properties of the QLEDs fabricated in Ex. 7 to 10 and Ref 2 were measured using the same process as Experimental Example 2. The measurement results are indicated in Table 3 below.

TABLE 3

Luminous Property of Red QLED

| Sample | Emissive Layer Structure | V | EQE (%) |
|---|---|---|---|
| Ref. 2 | HTL/EML(QD)/ETL | 4.7 | 1.57 |
| Ex. 7 | HTL/ECL(Liq)/EML(QD)/ETL | 4.6 | 2.34 |
| Ex. 8 | HTL/ECL1(Liq)/EML(QD)/ECL2(Liq, 3 nm)/ETL | 4.7 | 2.76 |
| Ex. 9 | HTL/ECL1(Alq$_3$)/EML(QD)/ECL2(Liq, 3 nm)/ETL | 4.9 | 2.62 |
| Ex. 10 | HTL/ECL1(Alq$_3$)/EML(QD)/ECL2(Alq$_3$, 3 nm)/ETL | 4.6 | 2.49 |

As indicated in Table 3, compared to the QLED in which any ECL was not introduced in Ref. 2, the QLEDs which introduce at least one ECL having the organometallic compound interacting with hydroxyquinoline in the emissive layer in Ex. 7 to 10 showed substantially equivalent driving voltages, and improved their EQE up to 75.8%. Compared Ex. 8 to Ex. 9, the overlapping region between the PL spectrum of Liq and the absorption spectrum of the green quantum dot is larger than the overlapping region between the PL spectrum of $Alq_3$ and the absorption spectrum of the red quantum dot (see, FIG. 7), thus FRET efficiency from Liq to the green quantum dot is improved, and the QLED in Ex. 8 has much improved luminous efficiency than the QLED in Ex. 9. Also, compared Ex. 9 to Ex. 10, in the ECL2 disposed between the EML and the ETL, Liq of ECL2 in Ex. 9 has a smaller bonding energy in the molecule than $Alq_3$ of ECL2 in Ex. 10, thus Liq is much efficient in protecting the quantum dot in the EML than $Alq_3$.

It will be apparent to those skilled in the art that various modifications and variations changes can be made in the present disclosure without departing from the scope of the invention. Thus, it is intended that the present disclosure cover the modifications and variations of the present disclosure provided they come within the scope of the appended claims and their equivalents.

What is claimed is:

1. An inorganic light emitting diode, comprising:
   a first electrode;
   a second electrode facing the first electrode;
   an emitting material layer disposed between the first and second electrodes and including an inorganic luminescent particle;
   a hole transfer layer disposed between the first electrode and the emitting material layer; and
   a first energy control layer disposed between the hole transfer layer and the emitting material layer,
   wherein the first energy control layer includes a first organometallic compound, and
   wherein the first organometallic compound interacts with a hydroxyquinoline moiety.

2. The inorganic light emitting diode of claim 1, wherein the first organometallic compound comprises a metal complex coordinated with the hydroxyquinoline moiety.

3. The inorganic light emitting diode of claim 1, wherein the first organometallic compound comprises an ionic metal compound including a metal component interacting with the hydroxyquinoline moiety.

4. The inorganic light emitting diode of claim 1, wherein the first organometallic compound includes a metal component selected from the group consisting of Li, Mg, Al, Cu, Zn, Be, Er and cation thereof.

5. The inorganic light emitting diode of claim 1, wherein the first organometallic compound comprises (8-hydroxyquinolinato) lithium, (2-methyl-8-hydroxyquinolinato) lithium, bis(hydroxyquinolinato) magnesium, bis(5-chloro-8-hydroxyquinolinato) magnesium, tris(8-hydroxyquinolinato) aluminum, bis(8-hydroxy-2-methylquinoline)-(4-phenylphenoxy) aluminum, bis(2-methyl-8-hydroxyquinolinato) aluminum hydroxide, tris(5,7-dichloro-8-hydroxyquinolinato)aluminum, tris(5-methyl-8-hydroxyquinolinato)aluminum, bis(2-amino-8-hydroxyquinolato)acetylaceto aluminum (III), bis (hydroxyquinolinato) copper, bis(hydroxyquinolinato) zinc, bis(5-chloro-8-hydroxyquinolinato) zinc, bis(5,7-dichloro-8-hydroxyquinolinato) zinc, bis(5,7-dimethyl-8-hydroxyquinolinato) zinc, [2-(2-hydroxyphenyl)benzoxazole (8-hydroxyquinolie)] zinc, bis(hydroxyquinolinato) beryllium, bis(5,7-dimethyl-8-hydroxyquinolinato) beryllium, tris(8-hydroxyquinolinato) erbium (III), or a combination thereof.

6. The inorganic light emitting diode of claim 1, wherein the inorganic luminescent particle comprises at least one of a quantum dot and a quantum rod.

7. The inorganic light emitting diode of claim 1, wherein the inorganic luminescent particle emits light of red to green wavelength ranges.

8. The inorganic light emitting diode of claim 1, wherein the first energy control layer has a thickness of about 1 nm to about 10 nm.

9. The inorganic light emitting diode of claim 1, wherein the first organometallic compound has a maximum photoluminescence peak between about 470 nm and about 550 nm.

10. The inorganic light emitting diode of claim 1, further comprising an electron transfer layer disposed between the emitting material layer and the second electrode.

11. The inorganic light emitting diode of claim 10, wherein the electron transfer layer comprises an inorganic electron transporting material.

12. The inorganic light emitting diode of claim 10, further comprises a second energy control layer disposed between the emitting material layer and the electron transfer layer.

13. The inorganic light emitting diode of claim 12, wherein the second energy control layer comprises a second organometallic compound interacting with a hydroxyquinoline moiety.

14. The inorganic light emitting diode of claim 13, wherein the second organometallic compound comprises a metal complex coordinated to the hydroxyquinoline moiety.

15. The inorganic light emitting diode of claim 13, wherein the second organometallic compound comprises an ionic metal compound including a metal component interacting with the hydroxyquinoline moiety.

16. The inorganic light emitting diode of claim 13, wherein the second organometallic compound includes a metal component selected from the group consisting of Li, Mg, Al, Cu, Zn, Be, Er, cation thereof and anion thereof.

17. The inorganic light emitting diode of claim 13, wherein the second organometallic compound comprises (8-hydroxyquinolinato) lithium, (2-methyl-8-hydroxyquinolinato) lithium, bis(5-chloro-8-hydroxyquinolinato) magnesium, tris(8-hydroxyquinolinato) aluminum, bis(8-hydroxy-2-methylquinoline)-(4-phenylphenoxy)aluminum, bis(2-methyl-8-hydroxyquinolinato) aluminum hydroxide, tris(5-methyl-8-hydroxyquinolinato) aluminum, bis(2-amino-8-hydroxyquinolato)acetylaceto aluminum, bis (hydroxyquinolinato) copper, bis(hydroxyquinolinato) zinc, bis(5-chloro-8-hydroxyquinolinato) zinc, bis(5,7-dichloro-8-hydroxyquinolinato) zinc, bis(5,7-dimethyl-8-hydroxyquinolinato) zinc, [2-(2-hydroxyphenyl)benzoxazole (8-hydroxyquinolie)] zinc, bis(hydroxyquinolinato) beryllium, bis(5,7-dimethyl-8-hydroxyquinolinato) beryllium, tris(8-hydroxyquinolinato) erbium, or a combination thereof.

18. The inorganic light emitting diode of claim 12, wherein each of the first energy control layer and the second energy control layer has a thickness of about 1 nm to about 10 nm, respectively.

19. An inorganic light emitting diode, comprising:
a first electrode;
a second electrode facing the first electrode;
an emitting material layer disposed between the first and second electrodes and including an inorganic luminescent particle;
a hole transfer layer disposed between the first electrode and the emitting material layer;
a first energy control layer disposed between the hole transfer layer and the emitting material layer; and
a second energy control layer disposed between the emitting material layer and the second electrode,
wherein the first and second energy control layers include a first organometallic compound and a second organometallic compound, respectively, and
wherein each of the first organometallic compound and the second organometallic compound interacts with a hydroxyquinoline moiety, respectively.

20. An inorganic light emitting device, comprising:
a substrate; and
the inorganic light emitting diode of claim 1 over the substrate.

21. An inorganic light emitting device, comprising:
a substrate; and
the inorganic light emitting diode of claim 19 over the substrate.

* * * * *